(12) United States Patent
Song et al.

(10) Patent No.: US 7,109,654 B2
(45) Date of Patent: Sep. 19, 2006

(54) ELECTROLUMINESCENCE DEVICE

(75) Inventors: Seung-Yong Song, Kyungki-do (KR); Jin-Woo Park, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 205 days.

(21) Appl. No.: 10/725,600

(22) Filed: Dec. 3, 2003

(65) Prior Publication Data
US 2004/0178727 A1    Sep. 16, 2004

(30) Foreign Application Priority Data
Mar. 14, 2003  (KR) ............... 10-2003-0016013
Jun. 14, 2003  (KR) ............... 10-2003-0038514

(51) Int. Cl.
*H05B 33/00* (2006.01)
(52) U.S. Cl. ................................................ 313/512
(58) Field of Classification Search ............. 313/498, 313/506, 512, 292, 634, 493; 428/917
See application file for complete search history.

(56) References Cited

U.S. PATENT DOCUMENTS

| 5,239,228 A | * | 8/1993 | Taniguchi et al. ......... 313/512 |
| 6,049,167 A | * | 4/2000 | Onitsuka et al. ........... 313/512 |
| 6,489,719 B1 | | 12/2002 | Young et al. |
| 6,784,612 B1 | * | 8/2004 | Park et al. ................. 313/512 |
| 2003/0062533 A1 | * | 4/2003 | Yee et al. ..................... 257/99 |
| 2003/0071567 A1 | * | 4/2003 | Eida et al. .................. 313/504 |

FOREIGN PATENT DOCUMENTS

| JP | 2000-100562 | * | 4/2000 |
| JP | 2000-173766 | * | 6/2000 |
| JP | 2004-79408 | * | 3/2004 |
| KR | 10-2003-0044659 | | 6/2003 |
| KR | 2003044659 A | * | 6/2003 |

* cited by examiner

*Primary Examiner*—Ashok Patel
(74) *Attorney, Agent, or Firm*—H.C. Park & Associates, PLC

(57) ABSTRACT

An electroluminescent (EL) device having a substrate with a light-emitting portion and a sealing member. The sealing member seals the light-emitting portion from the surrounding air. A groove accommodating a sealant is formed in at least one of seal portions of the substrate and the sealing member.

21 Claims, 5 Drawing Sheets

ELECTROLUMINESCENCE DEVICE

CROSS REFERENCE

This application claims the benefit of Korean Patent Application Nos. 03-16013 filed Mar. 14, 2003 and 03-38514 filed Jun. 14, 2003, the contents of which are incorporated herein by reference in its entirety.

BACKGROUND OF THE INVENTION

1. Field of the Invention

The invention relates to an organic electroluminescent device, and more particularly, to an electroluminescent device having an improved sealing structure.

2. Description of the Related Art

Electroluminescent devices have advantageous features suitable for next generation display devices. For example, electroluminescent devices have a wide viewing angle, a high contrast ratio and a high response speed. Electroluminescent (EL) devices are classified as inorganic EL devices and organic EL devices based on the materials which form the light-emitting layers.

FIG. 1 shows an organic EL device disclosed in U.S. Pat. No. 6,489,719. The disclosed organic EL device 1 comprises a substrate 2 having a positive electrode 3, a negative electrode 5 and a light-emitting layer 4 disposed between the positive electrode 3 and the negative electrode 5, and a sealing member 6 for sealing the substrate 2. Since the characteristics of the light-emitting layer 4 of the organic EL device deteriorate when exposed to moisture, it is necessary to isolate the light-emitting layer 4 from the moisture in the air.

Even if the substrate 2 and the sealing member 6 provide isolation, the sealing between the substrate 2 and the sealing member 6 is not perfect because of the physical properties of the adhesive 7 applied to adhere the sealing member 6 to the substrate 2. Thus, in order to minimize the amount of moisture infiltrating into the light-emitting layer 4 through the adhesive 7, it is preferable to reduce the thickness of the adhesive 7. In this case, however, there is a limit in reducing the thickness of the adhesive 7 because the adhesive 7 should be sufficiently applied to the substrate 2 and/or the sealing member 6 for the purpose of removing a gap therebetween. Consequently, in the organic EL device shown in FIG. 1 in which the gap (T) between the substrate 2 and the sealing member 6 is equal to the thickness of the adhesive 7 applied, it is difficult to satisfactorily prevent moisture in the air from infiltrating into the light-emitting layer 4, resulting in a shortened life of the organic EL device.

SUMMARY OF THE INVENTION

The invention provides an EL device having an increased life by minimizing infiltration of moisture in the air into a light-emitting layer of the organic EL device through an adhesive.

This invention separately provides an electroluminescent (EL) device comprising a substrate having a light-emitting portion and a sealing member sealing the light-emitting portion, wherein a groove accommodating a sealant is formed in at least one of seal portions of the substrate and the sealing member.

In various embodiments of the invention, the groove generally has a height of about 1 to 200 μm and a width of about 0.5 to about 3 mm.

In various embodiments of the invention, a peripheral portion of the seal portion of the substrate and a peripheral portion of the seal portion of the sealing member are generally adhered to each other.

In various embodiments of the invention, the peripheral portion of the seal portion of the substrate and the peripheral portion of the seal portion of the sealing member may be spaced apart from each other by spacers included in the sealant.

In various embodiments of the invention, some of the spacers are preferably disposed between the peripheral portion of the substrate seal portion and the peripheral portion of the sealing member seal portion. In this case, each of the spacers preferably has a diameter in the range of approximately 1 to 25 μm.

In various embodiments of the invention, the spacers are accommodated in the groove, and each of the spacers preferably has a diameter equal to the sum of the height of the groove and approximately 0.1 μm.

In various embodiments of the invention, infiltration of moisture in the air into a light-emitting layer through an adhesive can be minimized, thereby providing an EL device having a prolonged life.

BRIEF DESCRIPTION OF THE DRAWINGS

These features and advantages of the invention will become apparent and more readily appreciated from the following description of the exemplary embodiments, taken in conjunction with the accompanying drawings.

DETAILED DESCRIPTION OF THE INVENTION

Figure 1:
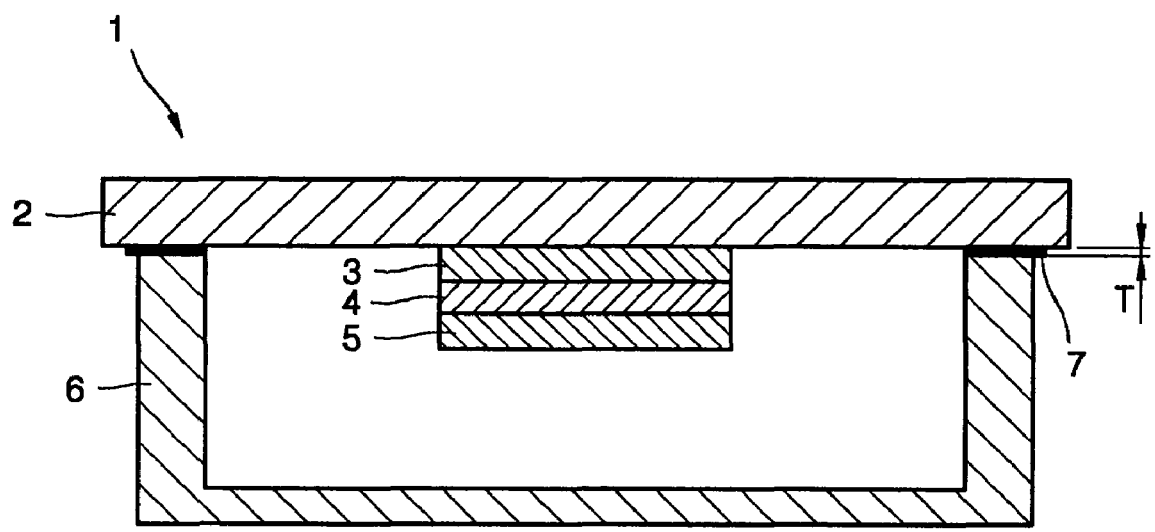
FIG. 1 is a cross-sectional view illustrating a conventional EL device.
Figure 2:
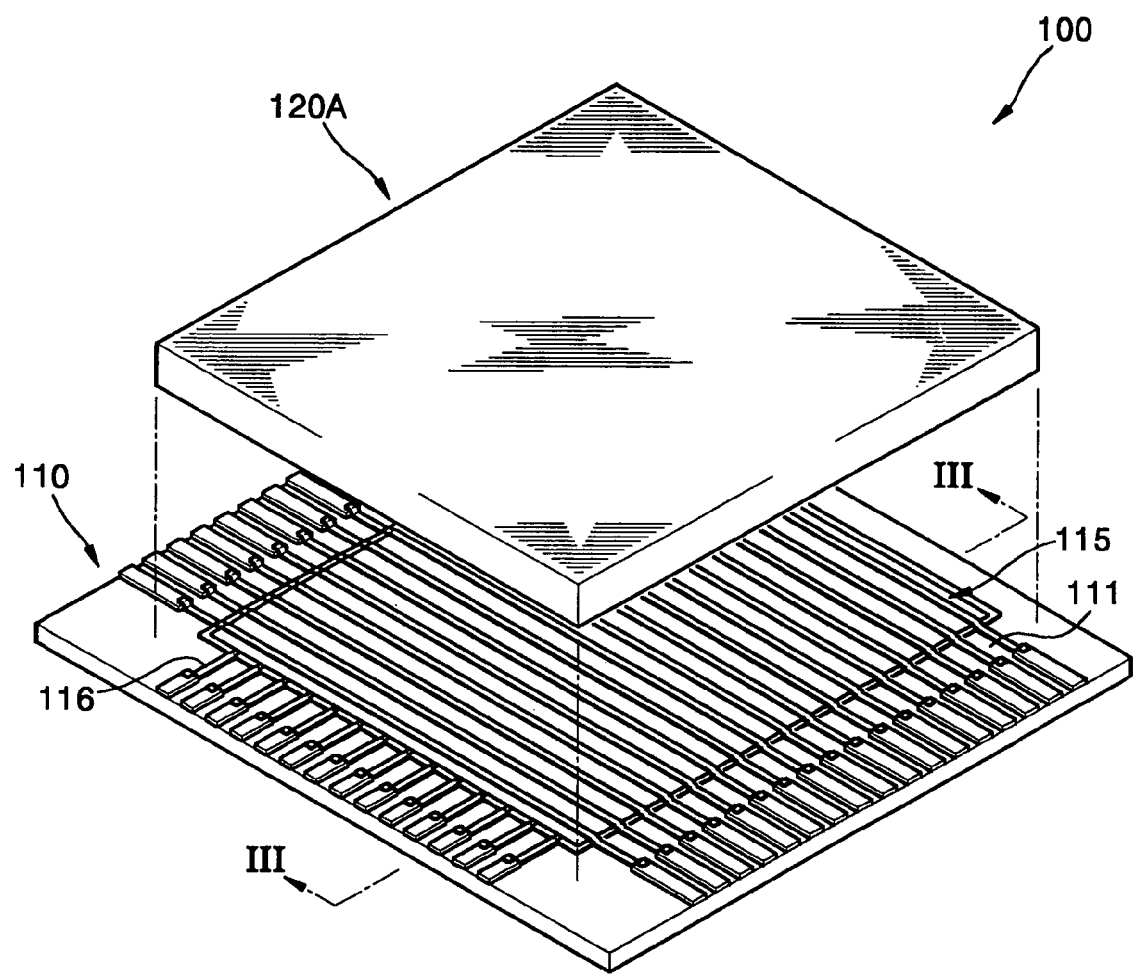
FIG. 2 is an exploded perspective view illustrating an EL device according to a first exemplary embodiment of the invention.
Figure 3:
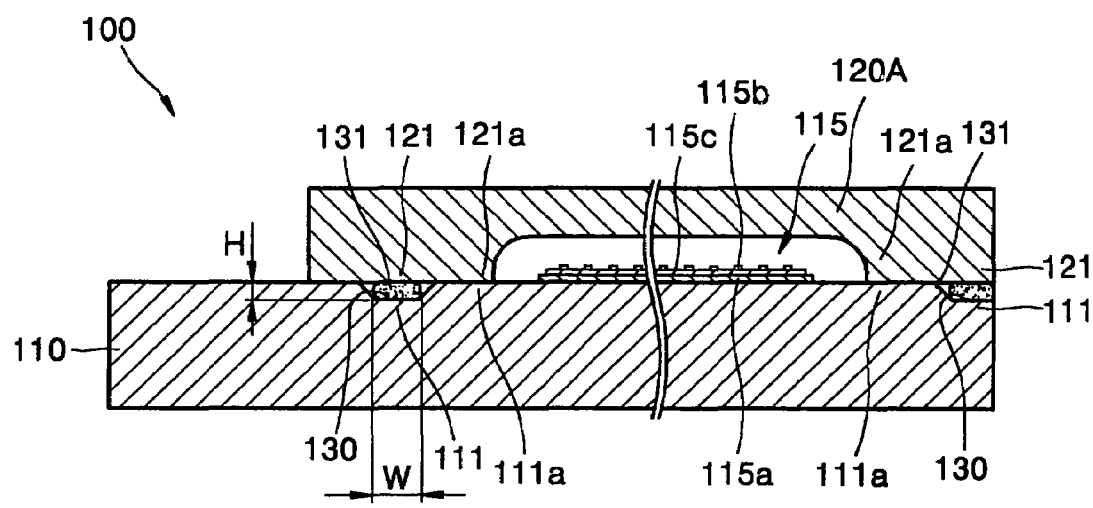
FIG. 3 is a cross-sectional view taken along the line III—III shown in FIG. 2.

Reference will now be made in detail to the exemplary embodiments of the invention, examples of which are illustrated in the accompanying drawings. Referring to FIGS. 2 and 3, an EL device 100 according to a first exemplary embodiment of the invention includes a substrate 110 having a light-emitting portion 115 and a sealing member sealing the light-emitting portion 115.

The substrate 110 may be formed of a transparent material, for example, glass, and the light-emitting portion 115 is generally formed at the center of the substrate 110. The light-emitting portion 115 has first electrodes 115a, a light-emitting layer 115c and second electrodes 115b sequentially stacked therein. The first and second electrodes 115a and 115b serve as a positive electrode and a negative electrode, or vice versa. The light-emitting layer 115c is formed of a material capable of emitting light according to an electrical signal applied to the first and second electrodes 115a and 115b. Each of the first and second electrodes 115a and 115b are electrically connected to a conductive line 116 extending outside the sealing member. The conductive line 116 may be integrally formed with the first electrode 115a or the second electrode 115b.

In this embodiment, the sealing member is a glass cap 120A, but it should be understood by one of ordinary skill in the art that the sealing member is not limited thereto. For example, the sealing member may be in the form of an insulating plate or an insulating film. Also, the sealing member may be, for example, a conductive metal cap. In this case, an insulating layer may be formed on the bottom surface of the metal cap in order to prevent a short-circuit between the conductive line 116 and the metal cap.

In the case of a passive matrix type light-emitting portion, as shown in FIG. 2, the first electrodes 115a are strips, and the second electrodes 115b are strips arranged so as cross the first electrodes 115a. The light-emitting portion according to the invention is not limited to the passive type, and may be, for example, of an active matrix type using a thin film transistor.

In the case where the EL device according to the invention is an organic EL device, the light-emitting portion 115c may include a first transport layer for transporting one of positive and negative charges from the first electrode 115a, a second transport layer for transporting the other of the positive and negative charges from the second electrode 115b, and an organic light-emitting layer interposed between the first and second transport layer. The organic light-emitting layer generating exciton by combination of the positive and negative charges transported from the first and second transport layers. The organic light-emitting layer may be formed, for example, of copper phthalocyanine (CuPc), N,N'-Di(naphthalene-1-yl)-N,N'-diphenyl-benzidine (NPB) or tris-8-hydroxyquinoline aluminum ($Alq_3$).

In the case where the EL device according to the invention is an inorganic EL device, the light-emitting portion 115c may include a first insulating layer and a second insulating layer formed on facing surfaces of the first electrode 115a and the second electrode 115b, respectively, and an inorganic light-emitting layer interposed between the first insulating layer and the second insulating layer and having electroluminescence core atoms. The inorganic light-emitting layer may be formed, for example, of metal sulfide, such as ZnS, SrS or CsS, or alkali earth potassium sulfide, such as $CaCa_2S_4$, or $SrCa_2S_4$. As the electroluminescence core atoms forming an inorganic light-emitting layer together with these inorganic compounds, transition metals including Mn, Ce, Tb, Eu, Tm, Er, Pr and Pb, or alkali rare-earth metals are used.

In general, one of the first and second electrodes 115a and 115b is formed of a transparent, conductive material, through which light emitted from the light-emitting layer can be transmitted, for example, indium tin oxide (ITO), and the other is formed of a highly reflective metal, for example, aluminum.

In this embodiment, a groove 130 capable of accommodating a sealant is formed in a seal portion 111 of the substrate 110. The groove 130 may be spaced apart from the edge of the substrate 110, as shown in the left portion of FIG. 3. Otherwise, the groove 130 may be formed at the edge of the substrate 110, as shown in the right portion of FIG. 3.

The height (H) of the groove 130 should be determined such that the sealant can be continuously applied for coating without intermission while preventing unnecessary use of the sealant. The height (H) of the groove 130 may be, for example, about 1 to about 200 μm according to the substance of the sealant. Also, the width (W) of the groove 130 should be in the range in which the sealant can be continuously applied for coating without intermission while preventing unnecessary enlargement of the substrate. The width (W) of the groove 130 may be, for example, about 0.5 to about 3 mm. Such a groove may be formed at the time of forming a substrate, and may be formed by cutting a seal portion of a flat substrate by sand blasting or etching.

Figure 4:
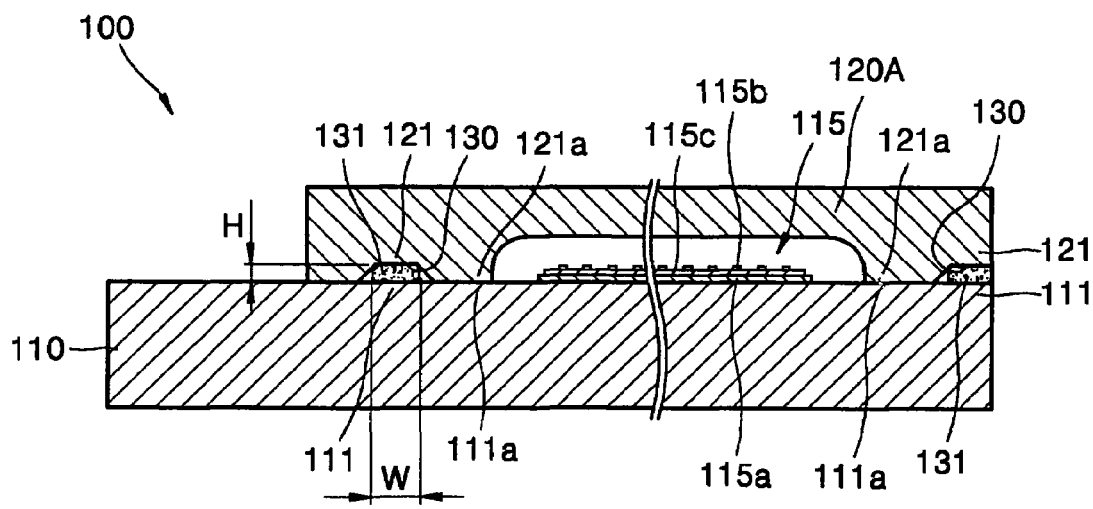
FIG. 4 is a cross-sectional view illustrating a modification of the EL device according to the first exemplary embodiment of the invention.

The seal portion 111 of the substrate 110 and the seal portion 121 of the glass cap 120A are adhered to each other by the sealant 131 accommodated in the groove 130. The sealant is formed, for example, of an epoxy material. The sealant is coated between the seal portion 111 of the substrate 110 and the seal portion 121 of the glass cap 120A, more specifically, at an area in which the sealant can be accommodated in the groove 130 formed at the seal portion 111 of the substrate 110. In a state in which the sealant is accommodated in the groove 130, a peripheral portion 111a of the seal portion 111 of the substrate 110 is adhered to a peripheral portion 121a of the seal portion 121 of the glass cap 120A. Here, the sealant in the groove 130 has higher thickness than the height (H) of the groove 130 due to its viscosity. Accordingly, the sealant can be adhered to both the substrate 110 and the glass cap 120A when the seal portion 111 of the substrate 110 and the seal portion 121 of the glass cap 120A are brought close to each other. In a state in which the substrate 110 and the glass cap 120A are adhered to each other by the sealant, the sealant has a cross section as shown in FIG. 3. Here, in order to prevent the contamination of the substrate 110 or the light-emitting portion 115 due to overflow of the sealant, the groove 130 is not fully filled with the sealant. As shown in FIGS. 3 and 4, for example, there is a space between a side of the sealant 131 and the edge of the groove 130.

As described above, since the peripheral portion 111a of the seal portion 111 of the substrate 110 is adhered to the peripheral portion 121a of the seal portion 121 of the glass cap 120A without a gap which may be caused by the thickness of the sealant, it is possible to effectively prevent moisture in the air from intruding into the light-emitting portion 115.

FIG. 4 shows a modification of the EL device according to the first exemplary embodiment of the invention, which is different from the first exemplary embodiment described above in that the groove 130 is formed at the seal portion 121 of the glass cap 120A instead of in the seal portion 111 of the substrate 110.

Figure 5:
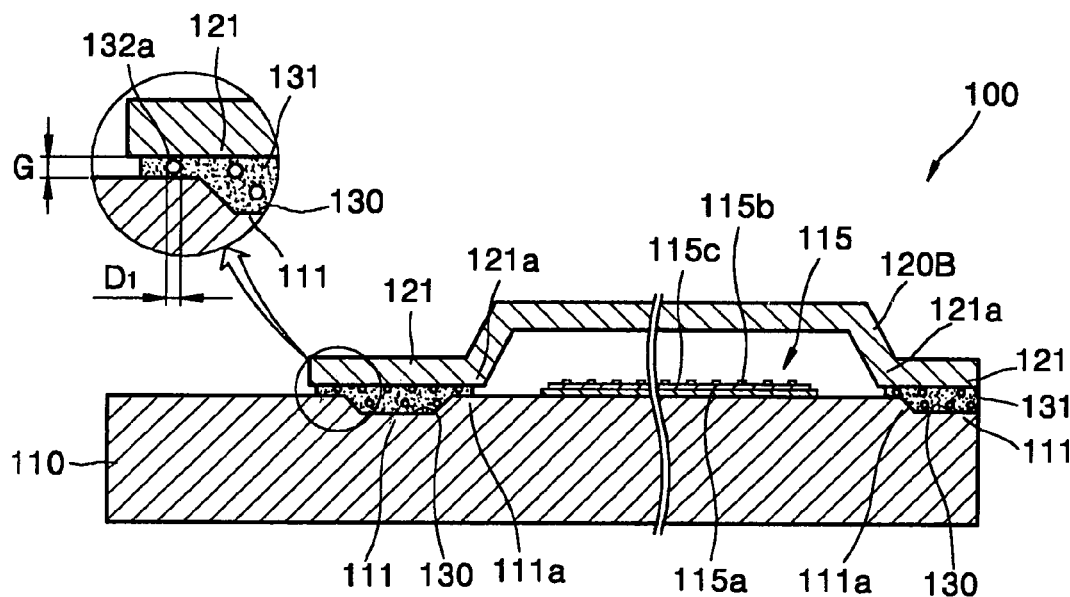
FIG. 5 is a cross-sectional view illustrating an EL device according to a second exemplary embodiment of the invention.

Referring to FIG. 5, an EL device according to a second exemplary embodiment of the invention will be described by comparison with the EL device according to the first exemplary embodiment of the invention. A metal cap 120B according to this exemplary embodiment corresponds to the glass cap 120A shown in FIG. 2, taken along the line III—III shown in FIG. 2.

If the sealing member for sealing the light-emitting portion 115 of the EL device is in the form of an insulating glass cap, plate or film, the sealing member is generally adhered to the substrate 110 as in the first embodiment. However, if the sealing member for sealing the light-emitting portion 115 of the EL device is in the form of a conductive metal cap 120B, generally, an insulating layer should be additionally formed on at least the bottom surface of the metal cap 120B.

Generally, however, forming an additional layer is disadvantageous in view of manufacturing cost.

However, as discussed in the following exemplary embodiment it is not necessary to provide an insulting layer. According to the second exemplary embodiment of the invention, there is provided an EL device having a small gap (G) between the substrate 110 and the metal cap 120B. In this case, an insulating layer is not formed on the bottom surface of the metal cap 120B. The sealing member according to this embodiment is not limited to the above-described metal cap, and a glass cap, plate or film can also be used as the sealing member.

The second exemplary embodiment is different from the first exemplary embodiment in that a spacer 132a is included in the sealant 131 and serves to maintain a gap (G) between the peripheral portion 111a of the substrate seal portion 111 and the peripheral portion 121a of the metal cap seal portion 121. Thus, short-circuiting between the conductive line (116 of FIG. 2) formed on the substrate 110 and the metal cap 120B can be prevented.

In particular, according to this embodiment, the sealant 131 is coated sufficiently enough to fill the groove 130 and to coat a portion of the peripheral portion 111a of the substrate seal portion 111. In such a state, if the substrate 110 and the metal cap 120B are brought close to each other, the spacer 132a included in the sealant 131 is disposed between at least a portion of the peripheral portion 111a of the substrate seal portion 111 and at least a portion of the peripheral portion 121a of the metal cap seal portion 121. Accordingly, the gap (G) between the substrate 110 and the metal cap 120B can be maintained constant.

The spacer 132a is generally spherical or cylindrical, and generally has the smallest diameter $(D_1)$ possible while preventing a short-circuit between the conductive line 116 and the metal cap 120B. As the diameter $(D_1)$ of the spacer 132a is reduced, the gap (G) between the substrate 110 and the metal cap 120B decreases, preventing substantially all the moisture in the air from intruding into the light-emitting portion 115. To meet this condition, the diameter $(D_1)$ of the spacer 132a is generally in the range of about 1 to 25 µm.

Figure 6:
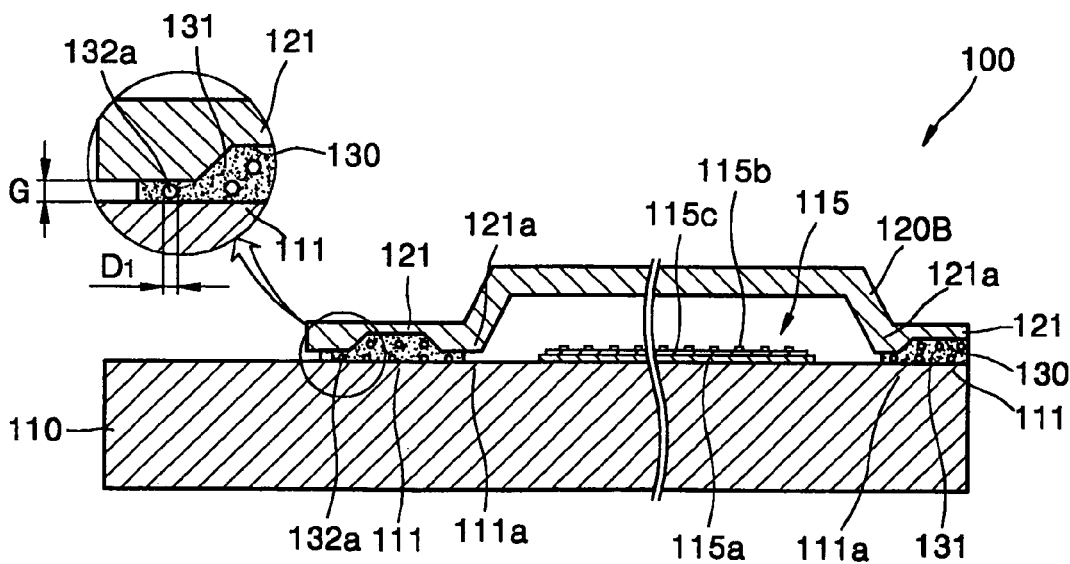
FIG. 6 is a cross-sectional view illustrating a modification of the EL device according to the second exemplary embodiment of the invention.

FIG. 6 is a cross-sectional view illustrating a modification of the EL device according to the second exemplary embodiment of the invention, which is different from the second exemplary embodiment of the invention described above in that the groove 130 is formed at the seal portion 121 of the metal cap 120B.

Figure 7:
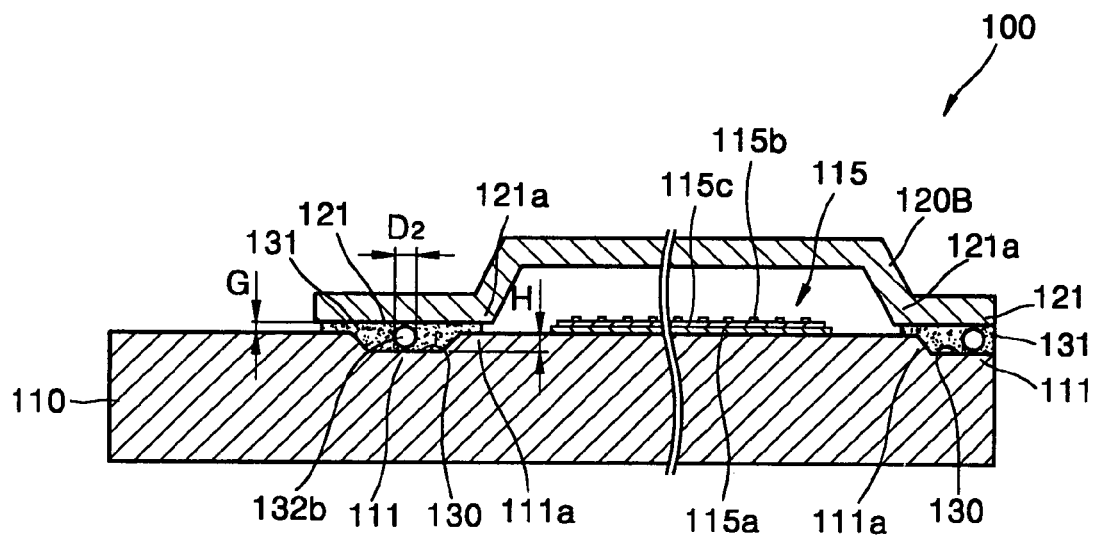
FIG. 7 is a cross-sectional view illustrating an EL device according to a third exemplary embodiment of the invention.

Referring to FIG. 7, an EL device according to a third exemplary embodiment of the invention will now be described by comparison with the EL device according to the second exemplary embodiment of the invention. A metal cap 120B according to this embodiment corresponds to the glass cap 120A shown in FIG. 2, taken along the line III—III of FIG. 2.

According to the third exemplary embodiment of the invention, there is provided an EL device having a small gap (G) between the substrate 110 and the metal cap 120B. In this case, an insulating layer is not formed on the bottom surface of the metal cap 120B. The sealing member according to this embodiment is not limited to the above-described metal cap. It should be understood by one with ordinary skill in the art that a glass cap, plate or film can also be used as the sealing member.

The third exemplary embodiment is different from the second exemplary embodiment in that a spacer 132b included in the sealant 131 is accommodated in the groove 130 and serves to maintain a gap (G) between the peripheral portion 111a of the substrate seal portion 111 and the peripheral portion 121a of the metal cap seal portion 121. Thus, a short-circuit between the conductive line (116 of FIG. 2) formed on the substrate 110 and the metal cap 120B can be prevented.

As shown in FIG. 7, the sealant 131 is generally coated on at least a portion of the peripheral portion 111a of the substrate seal portion 111. However, the sealant 131 is not necessarily coated widely enough to reach the peripheral portion 111a of the substrate seal portion 111. That is, the sealant 131 may be coated in the central portion of the groove 130, as shown in FIGS. 3 and 4. The spacer 132b included in the sealant 131 has a diameter greater than that of the spacer 132a in the second exemplary embodiment of the invention, and maintains the gap between the substrate seal portion 111 and the metal cap seal portion 121 constant.

The spacer 132b is generally spherical or cylindrical, and generally has a diameter $(D_2)$ corresponding to the sum of a height (H) of the groove 130 and the gap (G) between the substrate 110 and the metal cap 120B. The gap (G) is generally as small as possible to prevent moisture in the air from intruding into the light-emitting portion 115. Also, the gap (G) should be large enough to prevent a short-circuit between the conductive line 116 and the metal cap 120B. To meet these conditions, the diameter $(D_2)$ of the spacer 132b is generally equal to the height (H) of the groove 130 plus approximately 0.1 µm.

Figure 8:
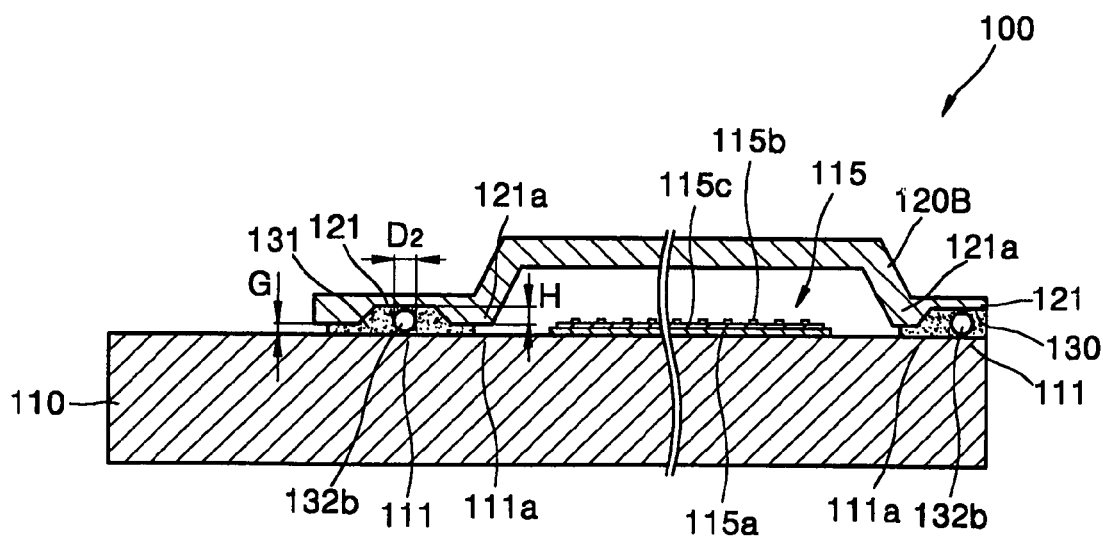
FIG. 8 is a cross-sectional view illustrating a modification of the EL device according to the third exemplary embodiment of the invention.

FIG. 8 is a cross-sectional view illustrating a modification of the EL device according to the third exemplary embodiment of the invention, which is different from the third exemplary embodiment in that the groove 130 is formed at the metal cap seal portion 121.

As described above, according to the invention, an EL device having prolonged life is provided by preventing moisture in the air from intruding into a light-emitting layer through a sealant.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An electroluminescent (EL) device, comprising:
   a substrate having a light-emitting portion and a sealing member,
   wherein the sealing member seals the light emitting portion and a groove accommodating a sealant is formed in at least one of seal portions of the substrate and the sealing member, and
   wherein a peripheral portion of the seal portion of the substrate and a peripheral portion of the seal portion of the sealing member are spaced apart from each other by at least one spacer included in the sealant.

2. The EL device of claim 1, wherein the groove has a height of about 1 to about 200 µm.

3. The EL device of claim 2, wherein at least a portion of the peripheral portion of the seal portion of the substrate and at least a portion of the peripheral portion of the seal portion of the sealing member has substantially no gap.

4. The EL device of claim 2, wherein some of the spacers are disposed between at least a portion of the peripheral portion of the substrate seal portion and at least a portion of the peripheral portion of the sealing member seal portion.

5. The EL device of claim 4, wherein each of the spacers has a diameter in the range of approximately 1 to approximately 25 µm.

6. The EL device of claim 2, wherein at least one spacer is accommodated in the groove.

7. The EL device of claim 6, wherein each of the spacers has a diameter equal to a sum of the height of the groove and the height of the gap.

8. The EL device of claim 7, wherein the height of the gap is approximately 0.1 μm.

9. The EL device of claim 1, wherein the groove has a width of about 0.5 to about 3 mm.

10. The EL device of claim 9, wherein at least a portion of the peripheral portion of the seal portion of the substrate and at least a portion of the peripheral portion of the seal portion of the sealing member has substantially no gap.

11. The EL device of claim 9, wherein some of the spacers are disposed between at least a portion of the peripheral portion of the substrate seal portion and at least a portion of the peripheral portion of the sealing member seal portion.

12. The EL device of claim 11, wherein each of the spacers has a diameter in the range of approximately 1 to approximately 25 μm.

13. The EL device of claim 9, wherein at least one spacer is accommodated in the groove.

14. The EL device of claim 13, wherein each of the spacers has a diameter equal to a sum of a height of the groove and the height of the gap.

15. The EL device of claim 14, wherein the height of the gap is approximately 0.1 μm.

16. The EL device of claim 1, wherein at least a portion of the peripheral portion of the seal portion of the substrate and at least a portion of the peripheral portion of the seal portion of the sealing member has substantially no gap.

17. The EL device of claim 1, wherein some of the spacers are disposed between at least a portion of the peripheral portion of the substrate seal portion and at least a portion of the peripheral portion of the sealing member seal portion.

18. The EL device of claim 17, wherein each of the spacers has a diameter in the range of approximately 1 to approximately 25 μm.

19. The EL device of claim 1, wherein at least one spacer is accommodated in the groove.

20. The EL device of claim 19, wherein each of the spacers has a diameter equal to a sum of a height of the groove and the height of the gap.

21. The EL device of claim 20, wherein the height of the gap is approximately 0.1 μm.

* * * * *